(12) United States Patent
Kim et al.

(10) Patent No.: US 12,082,313 B2
(45) Date of Patent: Sep. 3, 2024

(54) HEATER ASSEMBLY AND BONDING HEAD INCLUDING SAME

(71) Applicant: SEMES CO., LTD., Cheonan-si (KR)

(72) Inventors: Soon Hyun Kim, Incheon (KR); Byung Geun Kim, Cheonan-si (KR); Byoung Chan Lee, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 201 days.

(21) Appl. No.: 17/531,798

(22) Filed: Nov. 21, 2021

(65) Prior Publication Data

US 2022/0174786 A1    Jun. 2, 2022

(30) Foreign Application Priority Data

Nov. 30, 2020   (KR) .................. 10-2020-0164525

(51) Int. Cl.
| | | |
|---|---|---|
| H01L 21/67 | (2006.01) | |
| F28D 21/00 | (2006.01) | |
| H01L 21/683 | (2006.01) | |
| H05B 1/02 | (2006.01) | |
| H05B 3/06 | (2006.01) | |

(52) U.S. Cl.
CPC ....... *H05B 1/0233* (2013.01); *F28D 21/0015* (2013.01); *H01L 21/67144* (2013.01); *H05B 3/06* (2013.01); *H01L 21/6838* (2013.01)

(58) Field of Classification Search
CPC ..................... H05B 1/0233; F28D 21/0015
See application file for complete search history.

(56) References Cited

U.S. PATENT DOCUMENTS 8,789,573 B2    7/2014    Bibl et al.

FOREIGN PATENT DOCUMENTS

| EP | 3204210 | 8/2017 | |
|---|---|---|---|
| JP | 2000-013005 | 1/2000 | |
| JP | 2000013005 A * | 1/2000 | ............. H01L 24/75 |
| JP | 2007311679 A * | 11/2007 | |
| KR | 1020150141361 | 12/2015 | |

OTHER PUBLICATIONS

Sato, JP-2000013005-A and translation (Year: 2001).*
Nakanishi, JP-2007311679-A and translation (Year: 2007).*

* cited by examiner

*Primary Examiner* — Steven S Anderson, II

(57) ABSTRACT

A heater assembly includes a housing having an accommodation space therein and having a cooling gas inlet communicating with the accommodation space, a heater coupled to the housing, and a porous block disposed in the accommodation space.

8 Claims, 12 Drawing Sheets

HEATER ASSEMBLY AND BONDING HEAD INCLUDING SAME

CROSS REFERENCE TO RELATED APPLICATION

The present application claims priority to Korean Patent Application No. 10-2020-0164525, filed Nov. 30, 2020, the entire contents of which is incorporated herein for all purposes by this reference.

BACKGROUND OF THE INVENTION

Field of the Invention

The present disclosure relates to a bonding head that is used to mount dies on a substrate, and a heater assembly included in the bonding head.

Description of the Related Art

In general, a bonding head that picks up dies on a wafer and mounts the dies on a substrate is used in a die bonding process of mounting dies individualized through a sawing process onto a substrate such as a printed circuit board and a lead frame.

A bonding head has a collet for picking up dies using vacuum pressure and a body on which collet is mounted.

It is required to heat dies in order to mount the dies on a substrate. To this end, a bonding head includes a heater assembly including a heater.

The heater assembly further includes a cooling module configured to cool the heater. The cooling module is configured to cool the heater by spraying air to the heater. The cooling module has a plurality of air inlets for taking air inside, a plurality of cooling channels communicating with the air inlets, and a plurality of air outlets communicating with the cooling channels. The air outlets are disposed close to the heater.

According to this heater assembly of the related art, air flowing inside through the air inlets flows through the cooling channels and is then discharged outside through the air outlets. The air discharged from the air outlets hits against the heater, whereby the heater is cooled.

However, according to the heater assembly of the related art, the lengths of the cooling channels, that is, the distances between the air inlets and the air outlets are different, so the pressures and flow rates of the air that is discharged from the air outlets are different. Accordingly, there is a problem that the entire region of the heater is not uniformly cooled.

When the entire region of the heater is not uniformly cooled, as described above, temperature differences are generated in a plurality of regions of the heater. Further, the heater may be thermally deformed and damaged and the lifespan of the heater may be decreased due to the temperature differences.

DOCUMENTS OF RELATED ART (Patent Document 1) Korean Patent Application Publication No. 10-2015-0141361 (2015.12.18)

SUMMARY OF THE INVENTION

An objective of the present disclosure is to provide a heater assembly that can uniformly cool the entire region of a heater, and a bonding head including the heater assembly.

An embodiment of the present disclosure provides a heater assembly including: a housing having an accommodation space therein and having a cooling gas inlet communicating with the accommodation space; a heater coupled to the housing; and a porous block disposed in the accommodation space of the housing.

The heater may have a plurality of heat generation regions configured to have different temperatures from each other, and the porous block may be configured to pass a cooling gas received from the cooling gas inlet and supply a plurality of cooling gas flows of the cooling gas to the plurality of heat generation regions, respectively.

The heater may have a first region where heat is discharged at a first temperature and a second region where heat is discharged at a second temperature lower than the first temperature, the porous block may include a first porous member having a first porosity and a second porous member having a second porosity smaller than the first porosity, the first porous member may be disposed to correspond to the first region, and the second porous member may be disposed to correspond to the second region.

The first porous member may have more pores per unit volume than the second porous member.

The first porous member may have pores that are larger in volume than those of the second porous member.

The heater may have a first region where heat is discharged at a first temperature and a second region where heat is discharged at a second temperature lower than the first temperature, the porous block may include a first porous member having a first thickness and a second porous member having a second thickness larger than the first thickness, the first porous member may be disposed to correspond to the first region, and the second porous member may be disposed to correspond to the second region.

The first porous member may be spaced apart from the heater.

The heater may have a first region where heat is discharged at a first temperature and a second region where heat is discharged at a second temperature lower than the first temperature, the porous block may include a first porous member disposed to correspond to the first region and a second porous member disposed to correspond to the second region, the first porous member may be spaced apart from the first region and the second porous member may be in contact with the second region.

The heater may have a first region where heat is discharged at a first temperature and a second region where heat is discharged at a second temperature lower than the first temperature, and the porous block may be disposed only in the second region.

The heater may have a first region where heat is discharged at a first temperature and a second region where heat is discharged at a second temperature lower than the first temperature, and the porous block may be formed to cover only the second region.

The heater assembly according to an embodiment of the present disclosure may further include a baffle disposed between the cooling gas inlet and the porous block.

A heater assembly according to an embodiment of the present disclosure includes: a housing having an accommodation space therein and having a cooling gas inlet and a cooling gas outlet that communicate with the accommodation space; a heater coupled to the housing; a first porous block disposed in the accommodation space and communicating with the cooling gas inlet; and a second porous block disposed in the accommodation space and communicating with the cooling gas outlet.

The first porous block may be spaced apart from the heater, and a space between the first porous block and the heater may be a flow space through which a cooling gas flows.

The housing may have a base, the accommodation space may be formed by the base and the second porous block, and the heater may be coupled to the second porous block to seal the accommodation space.

The cooling gas outlet may be formed by spacing the base and the heater apart from each other.

The second porous block may be configured to support the first porous block, the base, and the heater.

The housing may have a base and a side disposed to surround the base, the accommodation space may be formed by the base and the side, and the heater may be coupled to the side to seal the accommodation space.

The cooling gas inlet may be formed at at least any one of the base and the side. That is, the cooling gas inlet may be formed at the base or the side or may be formed at both of the base and the side. The cooling gas outlet may be formed at at least any one of the base and the side. That is, the cooling gas outlet may be formed at the base or the side or may be formed at both of the base and the side.

According to an embodiment of the present disclosure, a bonding head that is configured to pick up and mount dies on a substrate includes: a collet configured to hold the dies; and the heater assembly described above and disposed close to the collet.

The bonding head according to an embodiment of the present disclosure may further include an insulation block configured to block heat generated by the heater assembly, and the heater assembly may be disposed between the collet and the insulation block.

According to an embodiment of the present disclosure, it is possible to uniformly cool the entire region of a heater, so it is possible to prevent temperature differences in a plurality of regions of the heater. Accordingly, it is possible to prevent the heater 32 from being thermally deformed and damaged and the lifespan of the heater 32 from being reduced due to temperature differences.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Hereafter, bonding heads according to embodiments of the present disclosure and heater assemblies including the bonding heads are described with reference to the accompanying drawings.

Figure 1:
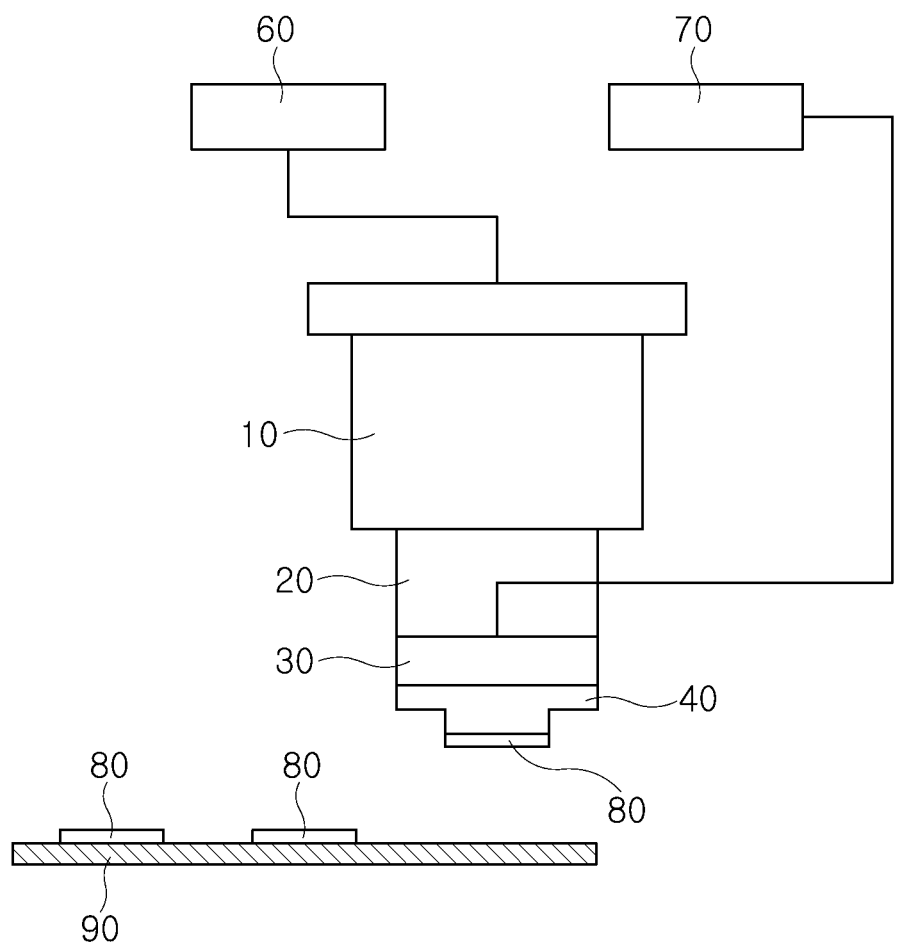
FIG. 1 is a view schematically showing a bonding head including a heater assembly according to an embodiment of the present disclosure.

As shown in FIG. 1, a bonding head according to an embodiment of the present disclosure is configured to pick up dies 80, which are individualized through a sawing process, from a wafer 90 including the dies 80. The bonding head is used to mount dies on a substrate such as a printed circuit board and a lead frame.

The bonding head includes a fixing block 10, an insulation block 20, a heater assembly 30, and a collet 40.

The fixing block 10 may be connected to a driving unit (not shown). The driving unit serves to horizontally and vertically move the bonding head.

The insulation block 20 prevents heat generated by the heater assembly 30 from transferring to the fixing block 10.

The collet 40 may be configured to suction the dies 80 using negative pressure. To this end, a negative pressure source 60 is connected to the collet 40. For example, the collet 40 may be made of a ceramic material.

Hereafter, the heater assembly 30 according to an embodiment of the present disclosure is described with reference to FIGS. 2 to 4.

The heater assembly 30 is disposed between the insulation block 20 and the collet 40. The heater assembly 30 serves to heat dies 80 picked up by the collet 40. The dies 80 heated by the heat generated by the heater assembly 30 can be thermally pressed on a substrate.

Figure 2:
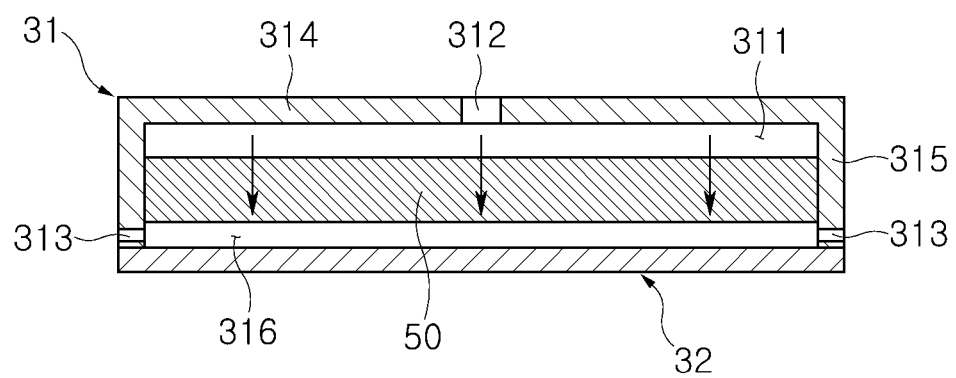
FIG. 2 is a view schematically showing an example of the heater assembly according to an embodiment of the present disclosure.

As shown in FIGS. 1 and 2, the heater assembly 30 includes a housing 31, a heater 32, and a porous block 50.

For example, the housing 31 may be made of a thermal conductive material. The housing 31 has an accommodation space 311 therein. The housing has a cooling gas inlet 312 and a cooling gas outlet 313 that communicate with the accommodation space 311. The cooling gas inlet 312 is connected to a cooling gas supplier 70 that supplies cooling gas.

The cooling gas that is supplied from the cooling gas supplier 70 may be air or inert gas. As another example, a refrigerant may be used as the cooling gas. The cooling gas supplier 70 can supply cooling gas at room temperature or lower.

The housing 31 may be formed in a shape with an open side. The heater 32 may be installed at the open side of the housing 31. The housing 31 may have a base 314 and a side 315.

The base 314 may be formed in a plate shape. The side 315 may be disposed to surround the base 314.

The accommodation space 311 may be formed by the base 314 and the side 315.

The cooling gas inlet 312 may be formed at the base 314. However, the present disclosure is not limited thereto and may be applied to a configuration in which the cooling gas inlet 312 is formed at the side 315. The housing 31 may have one or more cooling gas inlets 312. When a plurality of cooling gas inlets 312 is provided, the cooling gas inlets 312 may be disposed with regular intervals.

The cooling gas outlet 313 may be formed at the side 315. However, the present disclosure is not limited thereto and may be applied to a configuration in which the cooling gas outlet 313 is formed at the base 314. The housing 31 may have one or more cooling gas outlets 313. When a plurality of cooling gas outlets 313 is provided, the cooling gas outlets 313 may be disposed with regular intervals.

The heater 32 may be formed in a plate shape. The heater 32 may be coupled to the housing 31 to seal the accommodation space 311. For example, the heater 32 may be coupled to the side 315 of the housing 31.

The porous block 50 is disposed in the accommodation space 311 of the housing 31. The porous block 50 may have a plurality of pores through which a cooling gas can pass. In some embodiments, the plurality of pores may be connected with each other to form a plurality of internal passages (i.e., channels) through which the cooling gas may pass. The porous block 50 may have a predetermined porosity. The porosity may be the ratio of the total of the volumes of a plurality of pores to a unit volume. When the porosity is large, the flow rate of the cooling gas passing through the porous block 50 can be increased. However, when the porosity is small, the flow rate of the cooling gas passing through the porous block 50 can be decreased. The porous block 50 may be made of a porous ceramic material. For example, the porous block 50 may be produced by a method including a step of sintering aluminum oxide (Al2O3) powder or aluminum nitride (AlN) powder.

As cooling gas passes through the porous block 50, the pressure and flow rate of the cooling gas can become entirely uniform.

As shown in FIG. 2, the porous block 50 may be spaced apart from the heater 32. Accordingly, a flow space 316 may be formed between the porous block 50 and the heater 32. Accordingly, cooling gas can pass through the porous block 50, flow through the flow space 316, and then cool the heater 32 while coming in contact with the heater 32.

Figure 3:
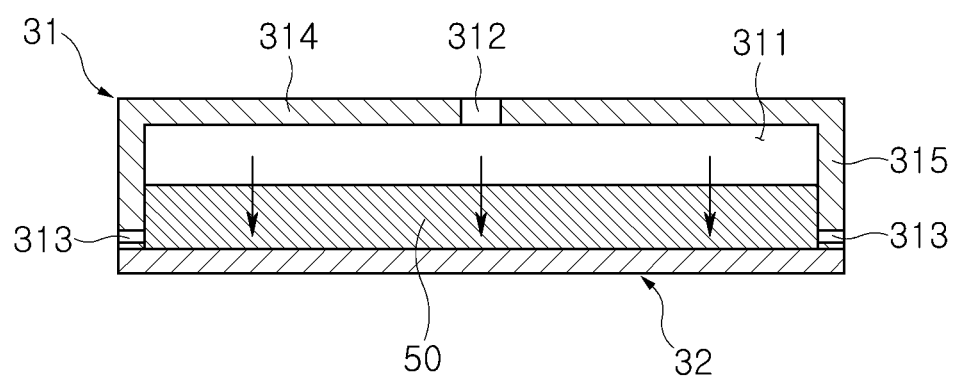
FIG. 3 is a view schematically showing another example of the heater assembly according to an embodiment of the present disclosure.

As another example, as shown in FIG. 3, the porous block 50 may be in contact with the heater 32. Accordingly, after passing through the porous block 50, cooling gas can cool the heater 32 while coming in contact with the heater 32.

Figure 4:
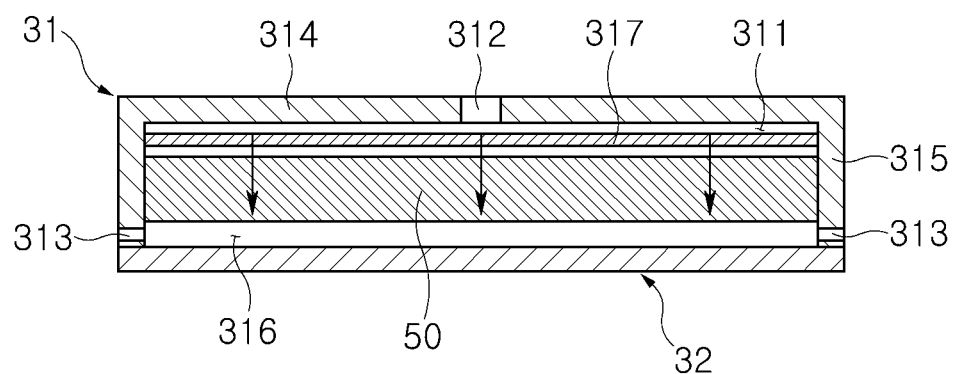
FIG. 4 is a view schematically showing another example of the heater assembly according to an embodiment of the present disclosure.

As another example, as shown in FIG. 4, a baffle 317 may be further disposed between the cooling gas inlet 312 and the porous block 50. The baffle 317 may be a net having predetermined meshes. As cooling gas flowing toward the porous block 50 from the cooling gas inlet 312 passes through the baffle 317, the pressure and flow rate of the cooling gas may become entirely uniform. Accordingly, the entire region of the heater 32 can be more uniformly cooled.

In the heater assembly 30 according to an embodiment of the present disclosure, as cooling gas passes through the porous block 50, the pressure and flow rate of the cooling gas can become entirely uniform. Accordingly, cooling gas can be uniformly transmitted to the entire region of the heater 32. Accordingly, the entire region of the heater 32 can be uniformly cooled, so temperature differences in a plurality of regions of the heater 32 can be prevented. Accordingly, it is possible to prevent the heater 32 from being thermally deformed and damaged and the lifespan of the heater 32 from being reduced due to temperature differences.

Meanwhile, although the configuration in which the heater 32 is coupled to the housing 31 is proposed in an embodiment of the present disclosure, the present disclosure is not limited thereto. As another example, the heater 32 may be spaced apart from the housing 31. In this case, the open side of the housing 31 can function as a cooing gas outlet and a separate cooling gas outlet 313 may not be formed at the base 314 or the side 315 of the housing 31. According to this configuration, the cooling gas flowing in the housing 31 through the cooling gas inlet 312 can be sprayed toward the heater 32 through the porous block 50. Further, the cooling gas sprayed through the porous block 50 can cool the heater 32 while hitting against the heater 32.

Hereafter, a heater assembly 30 according to an embodiment of the present disclosure is described with reference to FIGS. 5 to 8. The same components as those of the embodiment are given the same reference number and not described in detail.

The heater 32 of the heater assembly 30 according to an embodiment of the present disclosure may have a plurality of heat generation regions R1 and R2 where heat is generated at different temperatures. The embodiment of the present disclosure proposes a configuration in which the heater 32 has two heat generation regions R1 and R2, but the present disclosure is not limited thereto. As another example, the present disclosure may be applied to a configuration in which the heater 32 has three or more heat generation regions.

The porous block 50 may be configured such that the flow rate of cooling gas is different at the heat generation regions R1 and R2.

For example, the heat generation regions R1 and R2 may include a first region R1 where heat is discharged at a first temperature and a second region where heat is discharged at a second temperature lower than the first temperature.

Figure 5:
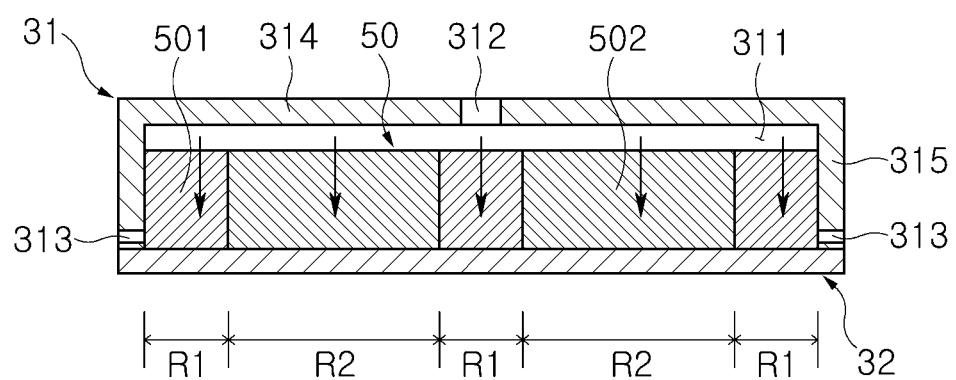
FIG. 5 is a view schematically showing an example of a heater assembly according to an embodiment of the present disclosure.

In order to make the flow rate of cooling gas different at the heat generation regions R1 and R2, as shown in FIG. 5, the porous block 50 includes a first porous member 501 having a first porosity and a second porous member 502 having a second porosity smaller than the first porosity. The first porous member 501 is disposed to correspond to the first region R1 and the second porous member 502 is disposed to correspond to the second region R2. In some embodiments, the first porous member 501 and the second porous member 502 may be formed of the same porous material as each other. In some embodiments, a porous material of the first porous member 501 may be different from a porous material of the second porous member 502.

The first porous member 501 and the second porous member 502 may be individually formed, but may be integrally formed.

As an example, the first porous member 501 may have more pores per unit volume than the second porous member 502. As another example, the first porous member 501 may pores that are larger in volume than those of the second porous member 502.

As described above, since there is a difference in porosity between the first porous member 501 and the second porous member 502, cooling gas can pass through the first porous member 501 at a relatively high flow rate and can pass through the second porous member 502 at a relatively low flow rate. Accordingly, cooling gas can be transmitted at a relatively high flow rate to the first region R1 and can be transmitted at a relatively low flow rate to the second region R2. Accordingly, the degree of cooling of the first region R1 may be larger than the degree of cooling of the second region R2. Accordingly, the first region R1 and the second region R2 may be cooled at the same or almost similar cooling speed and cooling temperature. Accordingly, the entire region of the heater 32 can be uniformly cooled.

Figure 6:
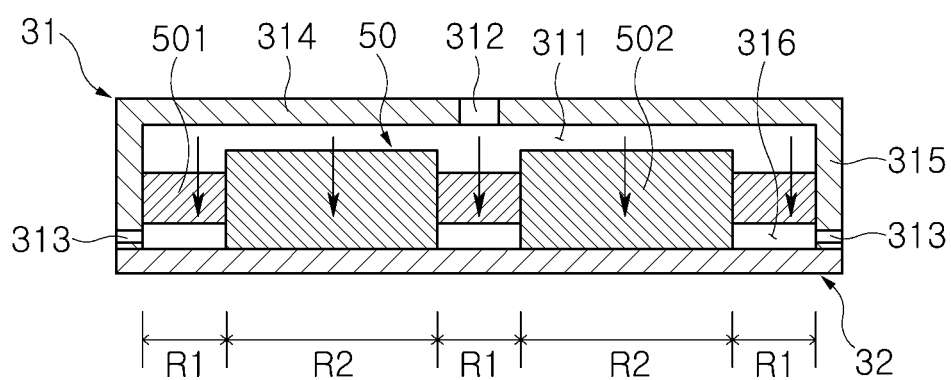
FIG. 6 is a view schematically showing another example of the heater assembly according to an embodiment of the present disclosure.

As another example, in order to make the flow rate of cooling gas different at the heat generation regions R1 and R2, as shown in FIG. 6, the porous block 50 includes a first porous member 501 having a first thickness and a second porous member 502 having a second thickness larger than the first thickness. The first porous member 501 is disposed to correspond to the first region R1 and the second porous member 502 is disposed to correspond to the second region R2.

The first porous member 501 and the second porous member 502 may be individually formed, but may be integrally formed.

In order to increase the thickness difference between the first porous member 501 and the second porous member 502, the first porous member 501 may be spaced apart from the heater 32. However, the present disclosure is not limited thereto and can be applied to a configuration in which the first porous member 501 is in contact with the heater 32, a configuration in which the second porous member 502 is in contact with the heater 32, a configuration in which both of first porous member 501 and the second porous member 502 are in contact with the heater 32, a configuration in which first porous member 501 is spaced apart from the heater 32, a configuration in which the second porous member 502 is spaced apart from the heater 32, and a configuration in which both of first porous member 501 and the second porous member 502 are spaced apart from the heater 32.

As described above, since there is a difference in thickness between the first porous member 501 and the second porous member 502, cooling gas can pass through the first porous member 501 at a relatively high flow rate and can pass through the second porous member 502 at a relatively low flow rate. Accordingly, cooling gas can be transmitted at a relatively high flow rate to the first region R1 and can be transmitted at a relatively low flow rate to the second region R2. Accordingly, the degree of cooling of the first region R1 may be larger than the degree of cooling of the second region R2. Accordingly, the first region R1 and the second region R2 may be cooled at the same or almost similar cooling speed and cooling temperature. Accordingly, the entire region of the heater 32 can be uniformly cooled.

Figure 7:
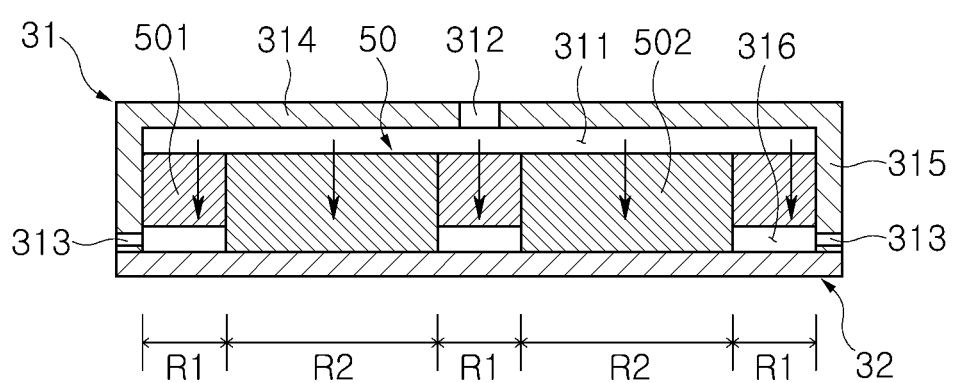
FIG. 7 is a view schematically showing another example of the heater assembly according to an embodiment of the present disclosure.

As another example, in order to make the flow rate of cooling gas different at the heat generation regions R1 and R2, as shown in FIG. 7, the porous block 50 includes a first porous member 501 disposed to correspond to the first region R1 and a second porous member 502 disposed to correspond to the second region R2. The first porous member 501 is spaced apart from the first region R1 and the second porous member 502 is in contact with the second region R2.

The first porous member 501 and the second porous member 502 may be individually formed, but may be integrally formed.

Since the first porous member 501 is spaced apart from the first region R1, a flow space 316 through which cooling gas flows is formed between the first porous member 501 and the first region R1.

Accordingly, the space occupied by the first porous member 501 decreases by the volume occupied by the flow space 316. Accordingly, the flow rate of the cooling gas that flows to the heater 32 through the first porous member 501 and the flow space 316 may be larger than the flow rate of the cooling gas that flows to the heater 32 through the second porous member 502.

As described above, since there is a difference in position between the first porous member 501 and the second porous member 502, cooling gas can pass through the first porous member 501 at a relatively high flow rate and can pass through the second porous member 502 at a relatively low flow rate. Accordingly, cooling gas can be transmitted at a relatively high flow rate to the first region R1 and can be transmitted at a relatively low flow rate to the second region R2. Accordingly, the degree of cooling of the first region R1 may be larger than the degree of cooling of the second region R2. Accordingly, the first region R1 and the second region R2 may be cooled at the same or almost similar cooling speed and cooling temperature. Accordingly, the entire region of the heater 32 can be uniformly cooled.

Figure 8:
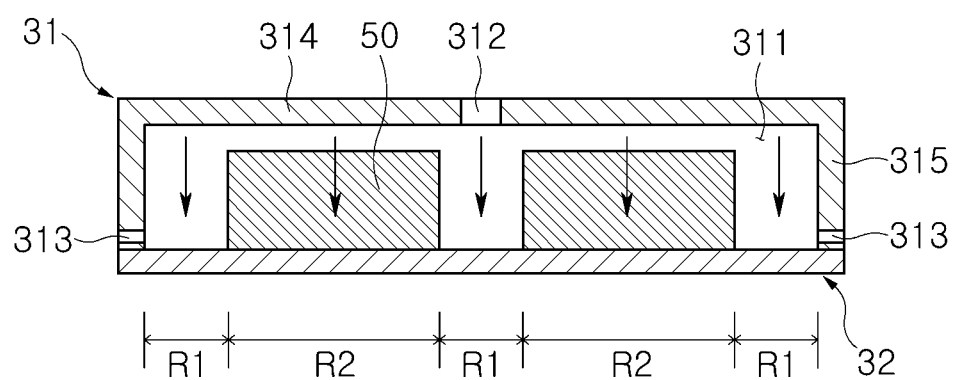
FIG. 8 is a view schematically showing another example of the heater assembly according to an embodiment of the present disclosure.

As another example, in order to make the flow rate of cooling gas different at the heat generation regions R1 and R2, as shown in FIG. 8, the porous block 50 may be disposed only in the second region R2. As another example, the porous block 50 may be formed to cover only the second region R2.

The flow rate of the cooling gas flowing to the heater 32 through the space where the porous block 50 is not disposed may be larger than the flow rate of the cooling gas flowing to the heater 32 through the space where the porous block 50 is disposed.

Depending on whether the porous block 50 is disposed, cooling gas may be transmitted at a relatively high flow rate to the first region R1 and may be transmitted at a relatively low flow rate to the second region R2. Accordingly, the degree of cooling of the first region R1 may be larger than the degree of cooling of the second region R2. Accordingly, the first region R1 and the second region R2 may be cooled at the same or almost similar cooling speed and cooling temperature. Accordingly, the entire region of the heater 32 can be uniformly cooled.

In the heater assembly 30 according to an embodiment of the present disclosure, since the flow rate of cooling gas depends on the heat generation regions R1 and R2 where heat having different temperatures is generated, the entire region of the heater 32 can be uniformly cooled. It is possible to prevent temperature differences in a plurality of regions of the heater 32. Accordingly, it is possible to prevent the heater 32 from being thermally deformed and damaged and the lifespan of the heater 32 from being reduced due to temperature differences.

Hereafter, a heater assembly 30 according to an embodiment of the present disclosure is described with reference to FIGS. 9 to 12. The same components as those of the embodiments described above are given the same reference number and not described in detail.

The heater assembly 30 according to an embodiment of the present disclosure includes a housing 31, a heater 32, a first porous block 51, and a second porous block 52.

Figure 9:
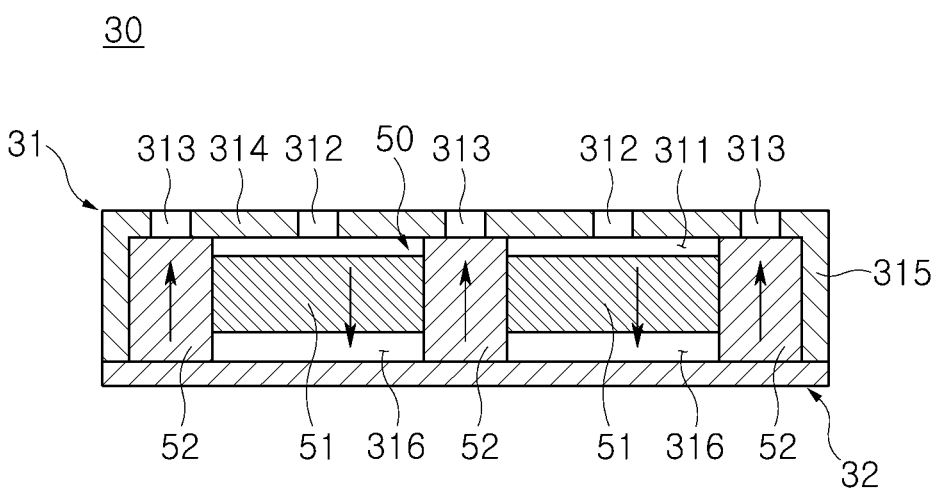
FIG. 9 is a view schematically showing an example of a heater assembly according to an embodiment of the present disclosure.

As shown in FIG. 9, the housing 31 has an accommodation space 311 therein. The housing has a cooling gas inlet 312 and a cooling gas outlet 313 that communicate with the accommodation space 311.

The heater 32 is coupled to the housing 31.

The first porous block 51 is disposed in the accommodation space 311. The first porous block 51 communicates with the cooling gas inlet 312. The first porous block 51 functions as a channel through which cooling gas flowing in the housing 31 through the cooling gas inlet 312 flows.

The second porous block 52 is disposed in the accommodation space 311. The second porous block 52 communicates with the cooling gas outlet 313. The second porous block 52 functions as a channel through which a cooling gas that is discharged out of the housing 31 through the cooling gas outlet 313 flows.

The first porous block 51 is spaced apart from the heater 32, whereby a flow space 316 through which cooling gas flows can be formed between the first porous block 51 and the heater 32.

The housing 31 includes a base 314 and a side 315 disposed to surround the base 314, and the accommodation space 311 is formed by the base 314 and the side 315. The heater 32 may be coupled to the side 315 to seal the accommodation space 311. The heater 32 may be supported by the second porous block 52.

The second porous block 52 may be in close contact with the base 314 and the heater 32.

Although an embodiment of the present disclosure proposes a configuration in which the cooling gas inlet 312 and the cooling gas outlet 313 are formed at the base 314, the present disclosure is not limited to this configuration. For example, the cooling gas inlet 312 may be formed at the base 314, the side 315, or the base 314 and the side 315, and the cooling gas outlet 313 may be formed at the base 314, the side 315, or the base 314 and the side 315.

Figure 10:
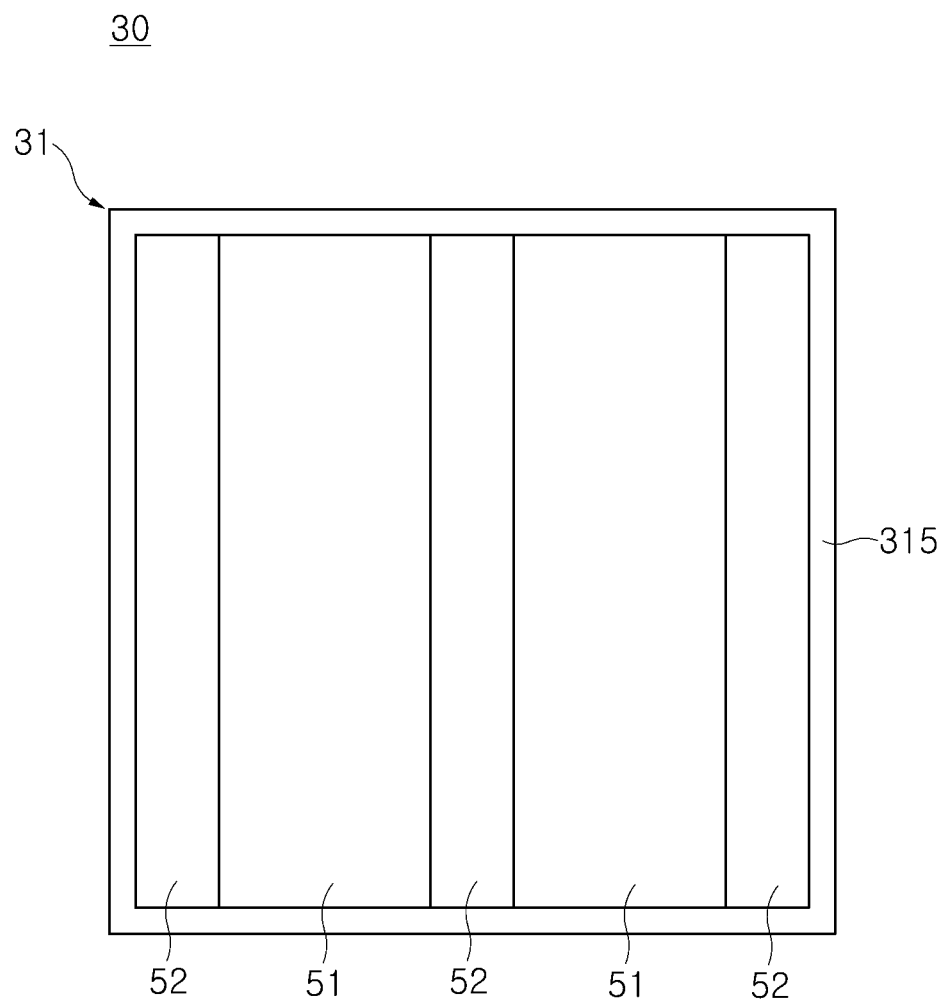
FIG. 10 is a view schematically showing another example of the heater assembly according to an embodiment of the present disclosure.

As an example, as shown in FIG. 10, the first porous block and the second porous block 52 may be formed straight and disposed in parallel with each other. The first porous block 51 may be supported by the second porous block 52.

Figure 11:
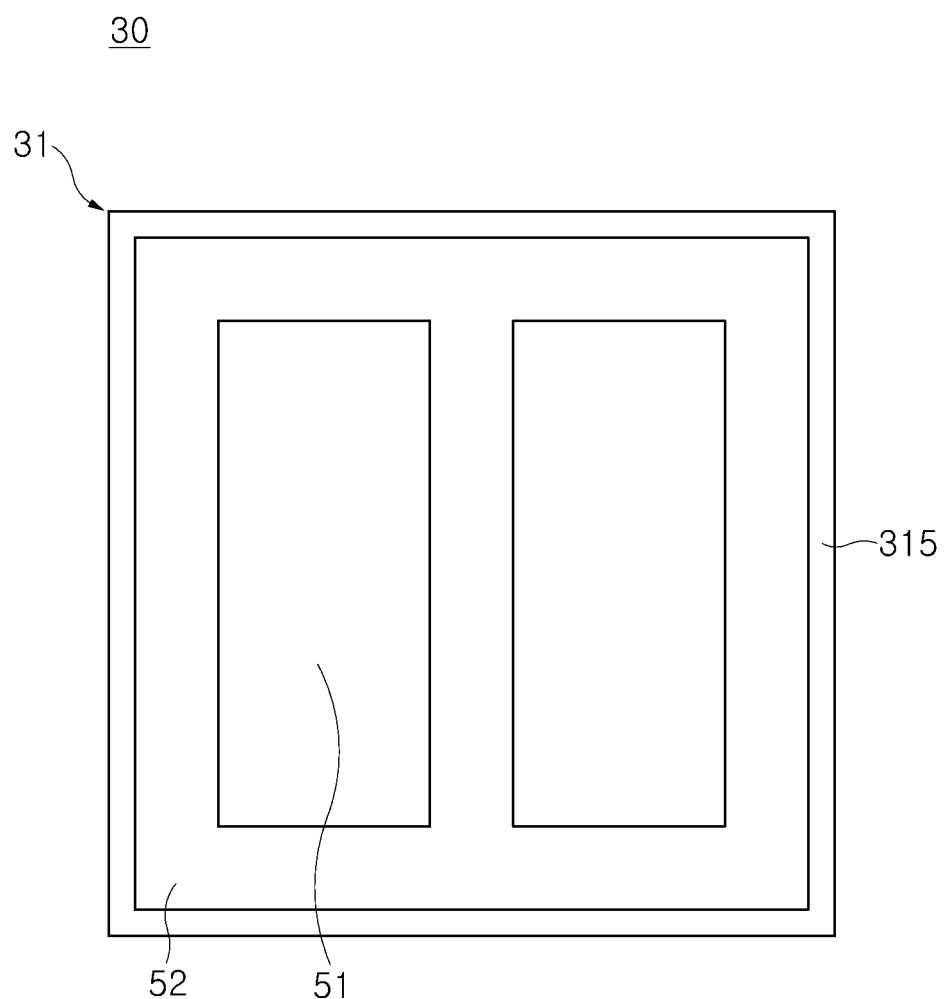
FIG. 11 is a view schematically showing another example of the heater assembly according to an embodiment of the present disclosure.

As another example, as shown in FIG. 11, the first porous block 51 may be disposed in the second porous block 52. That is, the second porous block 52 may be disposed to surround the first porous block 51. The first porous block 51 may be supported by the second porous block 52.

Figure 12:
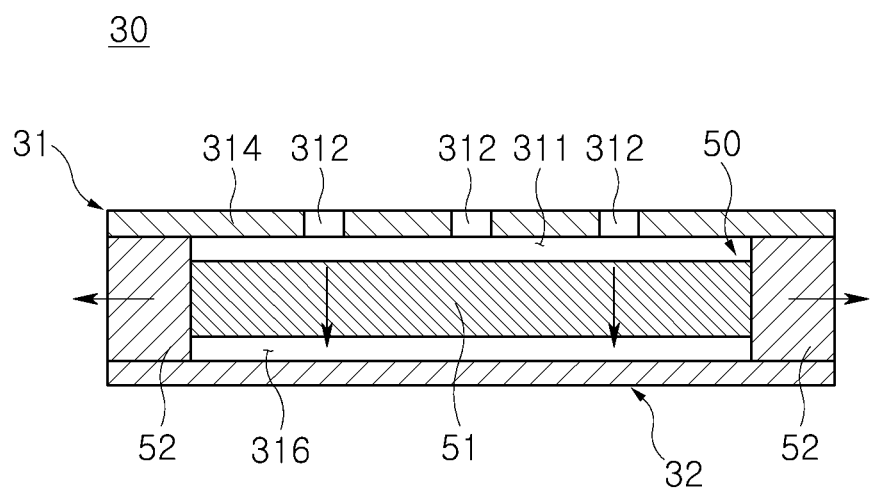
FIG. 12 is a view schematically showing another example of the heater assembly according to an embodiment of the present disclosure.

As another example, as shown in FIG. 12, the housing 31 may have the base 314 and the accommodation space 311 may be formed by the second porous block 52. The heater 32 may be coupled to second porous block 52 to seal the accommodation space 311.

According to this configuration, the housing 31 may not have the side 315. That is, the cooling gas outlet may be formed by spacing the base 314 and the heater 32 apart from each other.

According to an embodiment of the present disclosure, the first porous block 51, the base 314, and the heater 32 are supported by the second porous block 52. As described above, the second porous block 52 through which cooling gas can pass can be provided as a component for supporting the first porous block 51, the base 314, and the heater 32. Accordingly, it is possible to simplify the configuration of the heater assembly 30, as compared with when a supporting structure that supports the first porous block 51, the base 314, and the heater 32 and a discharge channel structure for discharging cooling gas are separately provided.

According to an embodiment of the present disclosure, as cooling gas passes through the first porous block 51, the pressure and flow rate of the cooling gas can become entirely uniform. Accordingly, cooling gas can be uniformly transmitted to the entire region of the heater 32. Accordingly, the entire region of the heater 32 can be uniformly cooled, so temperature differences in a plurality of regions of the heater 32 can be prevented. Accordingly, it is possible to prevent the heater 32 from being thermally deformed and damaged and the lifespan of the heater 32 from being reduced due to temperature differences.

Although exemplary embodiments of the present disclosure were described above, the scope of the present disclosure is not limited to those specific embodiments and may be appropriately changed within the range described in claims.

What is claimed is:

1. A heater assembly comprising:
   a housing having an accommodation space therein and having a cooling gas inlet communicating with the accommodation space;
   a heater coupled to the housing; and
   a porous block disposed in the accommodation space,
   wherein the heater has a plurality of heat generation regions configured to have different temperatures from each other, and
   wherein the porous block is configured to pass a cooling gas received from the cooling gas inlet and supply a plurality of cooling gas flows of the cooling gas to the plurality of heat generation regions, respectively.

2. The heater assembly of claim 1, further comprising:
   a baffle disposed between the cooling gas inlet and the porous block.

3. A heater assembly comprising:
   a housing having an accommodation space therein, a cooling gas inlet, and a cooling gas outlet, wherein each of the cooling gas inlet and the cooling gas outlet communicates with the accommodation space;
   a heater coupled to the housing;
   a first porous block disposed in the accommodation space and communicating with the cooling gas inlet; and
   a second porous block disposed in the accommodation space and communicating with the cooling gas outlet,
   wherein the housing has a base and a side disposed to surround the base,
   wherein the accommodation space is formed by the base and the side, and
   wherein the heater is coupled to the side to seal the accommodation space.

4. The heater assembly of claim 3,
   wherein the first porous block is spaced apart from the heater, and
   wherein a space between the first porous block and the heater is a flow space through which a cooling gas flows.

5. The heater assembly of claim 3,
   wherein the cooling gas inlet is formed at the base, the side, or the base and the side, and
   wherein the cooling gas outlet is formed at the base, the side, or the base and the side.

6. A heater assembly comprising:
   a housing having an accommodation space therein and having a cooling gas inlet communicating with the accommodation space;
   a heater coupled to the housing; and
   a porous block disposed in the accommodation space,
   wherein the heater has a first region where heat is discharged at a first temperature and a second region where heat is discharged at a second temperature lower than the first temperature, wherein the porous block includes a first porous member having a first porosity and a second porous member having a second porosity smaller than the first porosity,
wherein the first porous member is disposed to correspond to the first region, and
wherein the second porous member is disposed to correspond to the second region.

7. The heater assembly of claim 6,
wherein the first porous member has more pores per unit volume than the second porous member.

8. The heater assembly of claim 6,
wherein the first porous member has pores that are larger in volume than pores of the second porous member.

* * * * *